(12) United States Patent
Kitajima et al.

(10) Patent No.: US 7,565,739 B2
(45) Date of Patent: Jul. 28, 2009

(54) METHOD OF MAKING ZINC-ALUMINUM ALLOY CONNECTION

(75) Inventors: Masayuki Kitajima, Kawasaki (JP); Ryoji Matsuyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/430,052

(22) Filed: May 9, 2006

(65) Prior Publication Data
US 2007/0170593 A1    Jul. 26, 2007

(30) Foreign Application Priority Data
Jan. 26, 2006    (JP)    ............... 2006-018128

(51) Int. Cl.
*H01K 3/10*    (2006.01)
(52) U.S. Cl. ............... 29/852; 29/846; 174/262; 427/433
(58) Field of Classification Search ............... 29/831, 29/832, 840, 842, 843, 857, 860, 874, 875; 174/257, 262; 257/771, 772, 753, 765, 774, 257/775; 228/180.21; 427/433
See application file for complete search history.

(56) References Cited

U.S. PATENT DOCUMENTS

| | | | | |
|---|---|---|---|---|
| 3,956,821 A * | 5/1976 | Martin | ............... | 228/180.21 |
| 6,098,283 A * | 8/2000 | Goetsch et al. | ............... | 29/852 |
| 6,199,273 B1 * | 3/2001 | Kubo et al. | ............... | 29/843 |
| 6,207,259 B1 * | 3/2001 | Iino et al. | ............... | 174/257 |
| 6,299,785 B1 * | 10/2001 | Shimokawa et al. | ............... | 216/4 |
| 6,359,235 B1 | 3/2002 | Hayashi | ............... | 174/260 |
| 6,641,898 B2 | 11/2003 | Yazaki et al. | | |
| 6,713,687 B2 | 3/2004 | Yazaki et al. | | |
| 6,972,070 B2 | 12/2005 | Yazaki et al. | | |
| 2004/0066633 A1 | 4/2004 | Yazaki et al. | | |
| 2004/0177997 A1 * | 9/2004 | Hata et al. | ............... | 174/257 |
| 2005/0029670 A1 | 2/2005 | Doan | ............... | 257/774 |

FOREIGN PATENT DOCUMENTS

| | | |
|---|---|---|
| JP | 11-340610 | 12/1999 |
| JP | 2002-43751 | 2/2002 |
| JP | 2003-110243 | 4/2003 |

OTHER PUBLICATIONS

German Office Action dated Mar. 24, 2009, with English translation.

* cited by examiner

*Primary Examiner*—Donghai D. Nguyen
(74) *Attorney, Agent, or Firm*—Kratz, Quintos & Hanson, LLP

(57) ABSTRACT

A conductor is at least partially exposed on the surface of a body. A wiring is formed for connection to the conductor. The conductor is made of a Zn—Al alloy. Heat is then applied to the conductor and the wiring. A chemical reaction is accelerated between the conductor and the wiring based on the heat treatment. This allows oxygen to get released out of the conductor and the wiring. Deoxidation is thus realized on the joint surfaces of the conductor and the wiring. Electric resistance is decreased. Electric conduction can thus be established between the conductor and the wiring.

12 Claims, 9 Drawing Sheets

METHOD OF MAKING ZINC-ALUMINUM ALLOY CONNECTION

BACKGROUND OF THE INVENTION

1. Field of the Invention

The present invention relates to a product, a material, and the like, including a body and a conductor filling a hole defined in the body. In particular, the present invention relates to a printed wiring board employing the product.

2. Description of the Prior Art

Consideration is given to formation of a so-called through hole in a small-sized package printed wiring board. The through hole of the small-sized printed wiring board has a larger aspect ratio and a smaller inside diameter as compared with the through hole of a general large-sized printed wiring board. The inside of the through hole must be filled up with a conductor so as to avoid a larger increase in the electric resistance of the through hole.

A through hole can be filled with a solder alloy as described in Japanese Patent Application Publication No. 2002-43751. However, since the melting point of the solder alloy is relatively low, the solder alloy unintentionally melts at a later stage where the package printed wiring board is to be mounted on a printed circuit board, for example. The molten solder alloy is likely to flow out of the through hole in this case. A thorough hole can also be filled with an electrically-conductive paste as described in Japanese Patent Application Publication No. 2003-110243. However, the electrically-conductive paste cannot flow into a through hole having the aspect ratio of 2 approximately or larger. Electroless copper plating can also be utilized to fill the through hole, for example. However, the electroless copper plating suffers from a longer operating time for filling the minute through holes. This leads to a lower production efficiency.

SUMMARY OF THE INVENTION

It is accordingly an object of the present invention to provide a conductor capable of reliably filling a hole defined in a body. It is also an object of the present invention to provide a product, a material, a printed wiring board, and the like, employing the mentioned conductor, as well as a method of making the product, the material, the printed wiring board, and the like.

According to a first aspect of the present invention, there is provided a product comprising: a body defining a hole; and a conductor filling the hole, the conductor made of zinc or a Zn—Al alloy.

Zinc or the Zn—Al alloy melts at a temperature equal to or higher than 375 degrees Celsius. Molten Zinc or Zn—Al alloy reliably fills the hole defined in the body. Since zinc and Zn—Al alloy have an electric conductivity, the hole can reliably be filled up with a conductor. The product reliably remains solid even when the product is secondarily exposed to a heat causing a solder alloy to melt.

If Zn—Al alloy is utilized in the product, the Zn—Al alloy preferably contains aluminum at a content equal to or smaller than 1.0 weight %. The melting point of such a Zn—Al alloy can be kept equal to or higher than 400 degrees Celsius. The Zn—Al alloy can thus remain solid during a high temperature treatment such as anodic bonding. The Zn—Al alloy may contain aluminum at a content equal to or smaller than 20.0 weight %. The melting point of such a Zn—Al alloy can be kept in the range between 370 degrees Celsius and 440 degrees Celsius. The content of the aluminum may depend on the temperature of a heat to which the product is exposed.

The hole may be a through hole penetrating through the body. The through hole reliably enables introduction of the molten zinc or Zn—Al alloy into the hole. The aspect ratio of the hole may be set equal to or larger than 3. The molten zinc or Zn—Al alloy is allowed to reliably fill the through hole having the defined aspect ratio.

A glass substrate or a silicon substrate may be employed as the body. The glass substrate and the silicon substrate have the Vickers hardness of 550[Hv] approximately, for example. Zinc has the Vickers hardness smaller than 110[Hv]. A Zn—Al alloy containing aluminum at a content equal to or smaller than 20.0 weight % also has a Vickers hardness equal to or smaller than 110[Hv]. Accordingly, even if zinc or a Zn—Al alloy fills the hole of the glass substrate or the silicon substrate for forming the conductor, the conductor is reliably prevented from destruction in response to a change in the temperature.

According to a second aspect of the present invention, there is provided a printed wiring board comprising: a substrate defining a hole; and a conductor filling the hole, the conductor made of zinc or a Zn—Al alloy.

Zinc or the Zn—Al alloy melts at a temperature equal to or higher than 375 degrees Celsius. Molten Zinc or Zn—Al alloy reliably fills the hole defined in the body. Since zinc and Zn—Al alloy have an electric conductivity, the hole can reliably be filled up with a conductor. The product reliably remains solid even when the product is secondarily exposed to a heat causing a solder alloy to melt. The hole may be a through hole penetrating through the substrate.

At least one of a nickel plating film and a gold plating film may be formed over the inside surface of the hole. The plating film or films enables a reliable introduction of the molten zinc or Zn—Al into the hole.

A wiring pattern made of aluminum or copper may be formed on the surface of the substrate in the printed wiring board. The wiring pattern may be connected to the conductor. For example, the Zn—Al alloy serves to suppress the growth of an oxide film at the surface rather than the case of zinc only. This results in a reliable establishment of electric conduction between the conductor and the wiring pattern. The substrate may be made of glass, silicon or ceramic. Such a substrate is especially utilized for a small-sized package printed wiring board.

According to a third aspect of the present invention, there is provided a method of making a product, comprising: forming a wiring connected to a conductor at least partially exposed on the surface of a body, the conductor made of a Zn—Al alloy; and applying heat at least to the conductor and the wiring.

The method enables acceleration of a chemical reaction between the conductor and the wiring based on the heat treatment. This allows oxygen to get released out of the conductor and the wiring. Deoxidation is thus realized on the joint surfaces of the conductor and the wiring. Electric resistance is decreased. Electric conduction can thus be established between the conductor and the wiring.

The Zn—Al alloy preferably contains aluminum at a content equal to or smaller than 1.0 weight % in the same manner as described above. Otherwise, the Zn—Al alloy may contain aluminum at a content equal to or smaller than 20.0 weight %. The conductor may fill a through hole penetrating through the body. The aspect ratio of the through hole may be set equal to or larger than 3. The body may be made of glass, silicon or ceramic. The body may be a glass substrate, a silicon substrate or a ceramic substrate. The wiring may be made of aluminum or copper. The wiring may be a wiring pattern located on the surface of the body.

According to a fourth aspect of the present invention, there is provided a method of making a product, comprising forming a wiring connected to a conductor at least partially exposed on the surface of a body in an oxygen-free atmosphere, the conductor made of a Zn—Al alloy.

The addition of aluminum enables establishment of a thinner oxide film at the surface of the conductor made of the Zn—Al alloy. When the wiring is connected to the conductor in an oxygen-free atmosphere, electric conduction can reliably be established between the conductor and the wiring.

BRIEF DESCRIPTION OF THE DRAWINGS

The above and other objects, features and advantages of the present invention will become apparent from the following description of the preferred embodiments in conjunction with the accompanying drawings, wherein.

DESCRIPTION OF THE PREFERRED EMBODIMENTS

Figure 1:
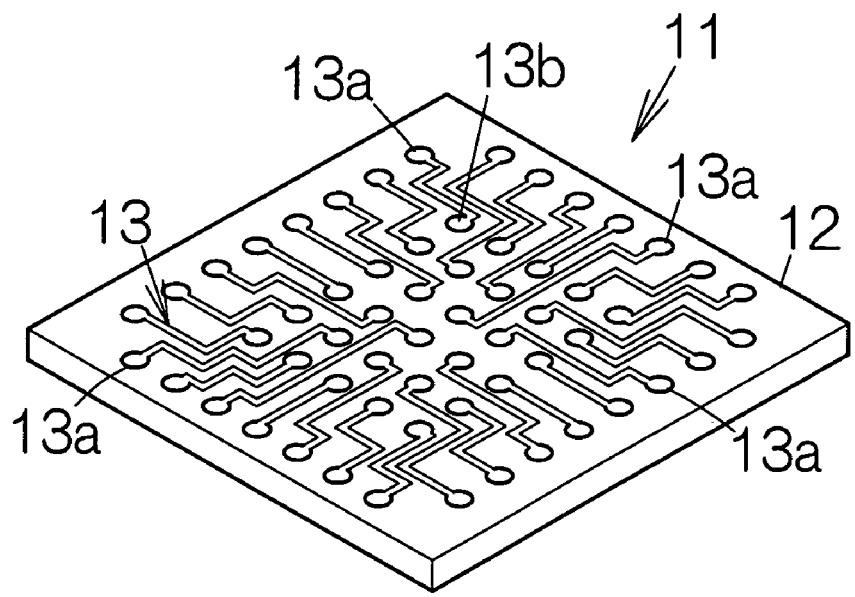
FIG. 1 is a perspective view schematically illustrating a package printed wiring board according to a first embodiment of the present invention.

FIG. 1 schematically illustrates a package printed wiring board 11 according to a first embodiment of the present invention. The package printed wiring board 11 includes a glass substrate 12. A wiring pattern 13 is formed on the front surface of the glass substrate 12. The wiring pattern 13 is made of an electrically-conductive material such as aluminum or copper. Pads 13a, 13b are defined in the wiring pattern 13, for example. The pads 13a are located on the glass substrate 12 along the outer periphery of the glass substrate 12. The pads 13b are located at positions in an area inside the rows of the pads 13a. The package printed wiring board 11 may employ an inorganic substrate such as a silicon substrate or a ceramic substrate in place of the glass substrate 12. It should be noted that the glass substrate 12 may have any thickness. Here, the thickness of the glass substrate 12 is set at 400 μm approximately, for example.

Figure 2:
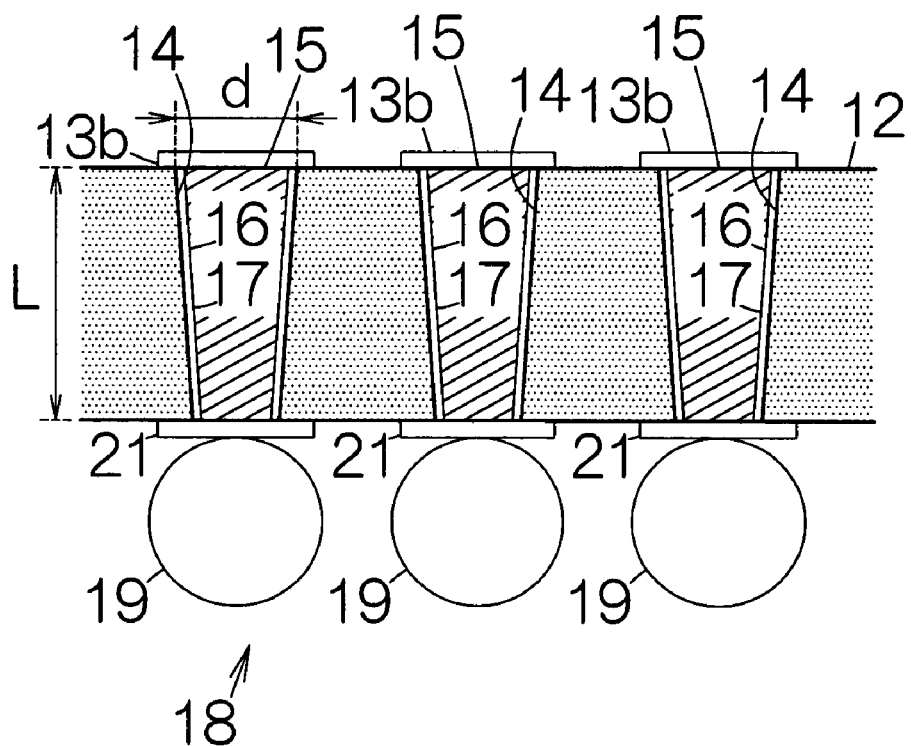
FIG. 2 is an enlarged partial sectional view illustrating the structure of the package printed wiring board in detail.

As shown in FIG. 2, through holes 14 are formed in the glass substrate 12. The through holes 14 extend in the vertical direction perpendicular to the front surface of the glass substrate 12. The through holes 14 penetrate through the glass substrate 12 from the front surface to the back surface. The individual through hole 14 has an inside diameter in the range between 20 μm and 100 μm, approximately. The individual through hole 14 thus has an aspect ratio (L/d) set in the range between 4 and 20, approximately.

A columnar conductor 15 is embedded in the individual through hole 14. The columnar conductor 15 completely fills the through hole 14. The columnar conductor 15 is preferably made of zinc or a zinc-aluminum (Zn—Al) alloy, as described later in detail. Here, a nickel plating film 16 and a gold plating film 17 are in this sequence formed on the inside surface of the individual through hole 14. The columnar conductor 15 is connected to the corresponding pad 13b of the wiring pattern 13 on the front surface of the glass substrate 12. Utilization of a Zn—Al alloy enables a reliable establishment of electric conduction between the pads 13b and the corresponding columnar conductors 15.

A ball grid array 18 is formed on the back surface of the glass substrate 12. The ball grid array 18 includes ball terminals 19, 19, . . . . The ball terminals 19 may be made of a solder, for example. The ball terminals 19 are individually received on metallic pads 21 formed on the back surface of the glass substrate 12, for example. The metallic pads 21 may be made of an electrically-conductive material such as aluminum or copper. The individual metallic pad 21 is connected to the corresponding columnar conductor 15 at the back surface of the glass substrate 12. A path is in this manner established for signals from the wiring pattern 13 to the individual ball terminal 19.

Figure 3:
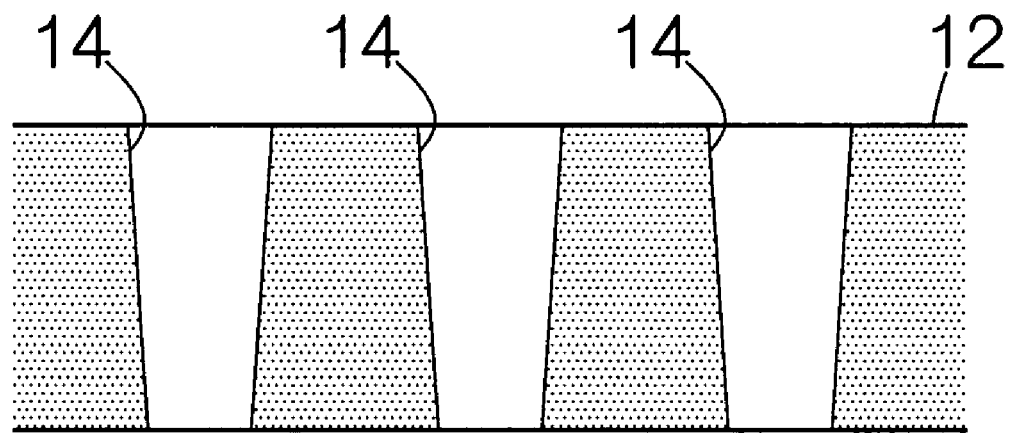
FIG. 3 is an enlarged partial sectional view, corresponding to FIG. 2, for illustrating through holes formed in a glass substrate.

As shown in FIG. 3, a glass substrate 12 is first prepared in a method of making the package printed wiring board 11, for example. The through holes 14 are defined in the glass substrate 12 at positions set in accordance with a predetermined matrix. The inside diameter of the individual through hole 14 is set in the range between 20 μm and 100 μm approximately, for example. A laser beam, deep reactive ion etching (RIE), sandblast, or the like, may be utilized to form the through holes 14, for example.

Figure 4:
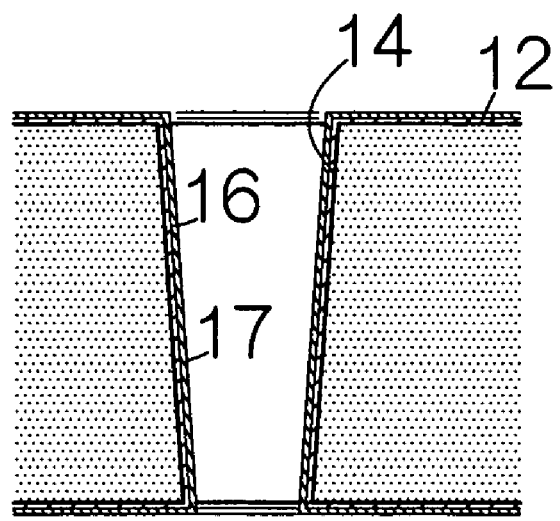
FIG. 4 is an enlarged partial sectional view of the glass substrate for schematically illustrating a nickel plating film and a gold plating film formed in the through hole.

The glass substrate 12 is then subjected to electroless nickel plating and electroless gold plating in this sequence. This results in establishment of the nickel plating film 16 and the gold plating film 17 layered in this sequence over the inside surface of the individual through hole 14, as shown in FIG. 4. The glass substrate 12 is then immersed in flux in an ultrasonic washer. Ultrasonic wave is applied for one minute, for example. The through holes 14 are in this manner filled with the flux.

Figure 5:
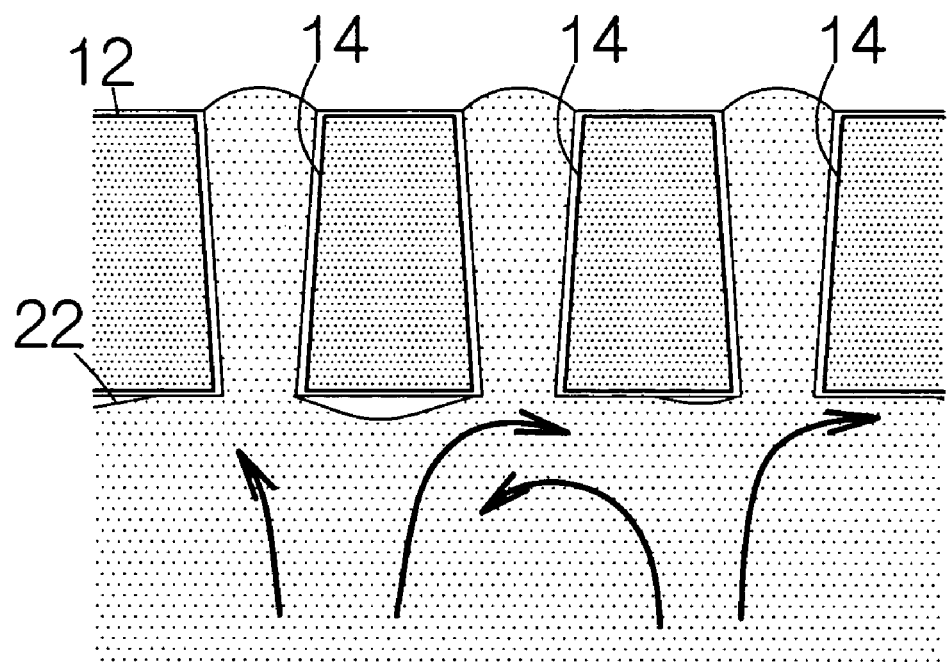
FIG. 5 is an enlarged partial sectional view of the glass substrate, corresponding to FIG. 2, for schematically illustrating the through holes filled with a molten Zn—Al alloy.

The through holes 14 are then filled with a Zn—Al alloy. As shown in FIG. 5, the glass substrate 12 is immersed in a molten Zn—Al alloy 22. A jet solder bath is utilized for the immersion. The back surface of the glass substrate 12 is set perpendicular to the direction of the jet during the immersion. The immersion may be carried out in the atmosphere. The glass substrate 12 may be kept at the normal or room temperature prior to the immersion. The immersion may be kept for ten seconds approximately so that the through holes 14 are completely filled with the molten Zn—Al alloy 22. The capillary action of the through holes 14 allows the molten Zn—Al alloy 22 to run through the thorough holes 14 from the back surface of the glass substrate 12 to the front surface of the glass substrate 12. The glass substrate 12 is then cooled down to the normal or room temperature. The columnar conductors 15 are in this manner established.

Figure 6:
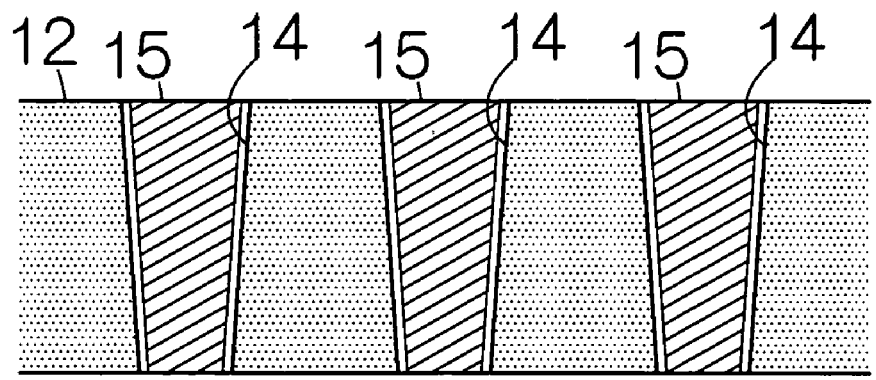
FIG. 6 is an enlarged partial sectional view of the glass substrate, corresponding to FIG. 2, for illustrating the glass substrate after polishing process.

Polishing process such as lapping process is then applied to the front and back surfaces of the glass substrate 12. The columnar conductors 15 after cooled down wells out of the through holes 14 to some extent at the front and back surfaces of the glass substrate 12. The polishing process serves to remove the excess of the columnar conductors 15 from the front and back surfaces of the glass substrate 12. The nickel plating film 16 and the gold plating film 17 adhered to the front and back surfaces of the glass substrate 12 are simultaneously removed. A flat surface is in this manner established on the front and back surfaces of the glass substrate 12. The columnar conductors 15 are exposed at the flat surfaces of the glass substrate 12, as shown in FIG. 6.

The wiring pattern 13 is then formed on the front surface of the glass substrate 12. Aluminum is evaporated onto the front surface of the glass substrate 12 in the atmosphere. A resist film may be formed on the front surface of the glass substrate 12 prior to the evaporation, for example. The resist film is patterned to have voids corresponding to the shape of the wiring pattern 13. Likewise, the metallic pads 21 are formed on the back surface of the glass substrate 12. The resist film may be removed off after the establishment of the wiring pattern 13 and the metallic pads 21.

The glass substrate 12 is subjected to heat treatment after the formation of the wiring pattern 13 and the metallic pads 21. The glass substrate 12 may be placed in the atmosphere of 150 degrees Celsius for 2 hours, for example. Zinc contained in the columnar conductors 15 diffuses into the pads 13b of the wiring pattern 13 and the metallic pads 21 in response to the applied heat. Intermetallic bonding is accelerated at the joint surface between the wiring pattern 13 and the columnar conductors 15. Likewise, intermetallic bonding is accelerated at the joint surface between the metallic pads 21 and the columnar conductors 15. This results in establishment of electric conduction between the wiring pattern 13 and the columnar conductors 15 as well as between the metallic pads 21 and the columnar conductors 15.

Figure 7:
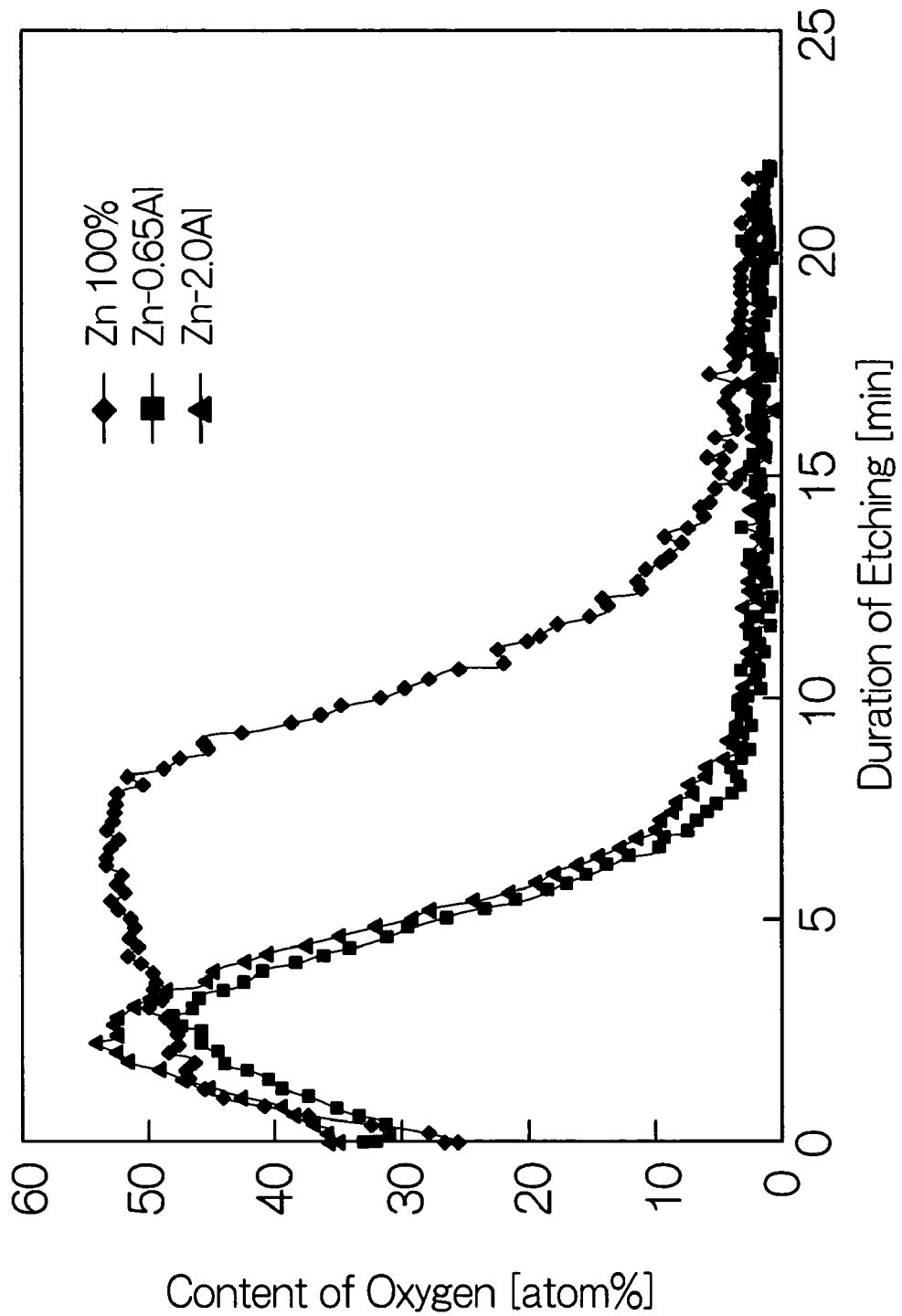
FIG. 7 is a graph showing the relationship between the content of oxygen and the distance or depth from the exposed surface of a columnar conductor.

The present inventors have examined the difference between zinc and a Zn—Al alloy. The present inventors have first observed the oxidation of the columnar conductors 15 exposed at the front surface of the glass substrate 12 after the aforementioned polishing process. The inventors prepared the columnar conductors 15 made of zinc, the columnar conductors 15 made of Zn-0.65Al alloy containing aluminum at 0.65 weight %, and the columnar conductors 15 made of Zn-2.0Al alloy containing aluminum at 2.0 weight %. The content of oxygen was measured at the exposed surface of each of the columnar conductors 15. An Auger electron spectrometer (AES) was used. The columnar conductors 15 were subjected to etching during the measurement. The etching serves to peel off the current exposed surfaces of the columnar conductors 15 so as to establish new exposed surfaces of the columnar conductors 15. The concentration of oxygen was specified for various depths from the original exposed surface in the columnar conductors 15. As is apparent form FIG. 7, it has been revealed that the addition of aluminum enables establishment of a thinner oxide film at the surface of the columnar conductors 15. The thickness of the oxide film was reduced to half the thickness or smaller. The observation of the inventors has revealed that a Zn—Al alloy containing aluminum at a content smaller than 10 ppm by weight is allowed to realize an oxide film equivalent to that of Zn-0.65Al alloy and Zn-2.0Al alloy.

Figure 8:
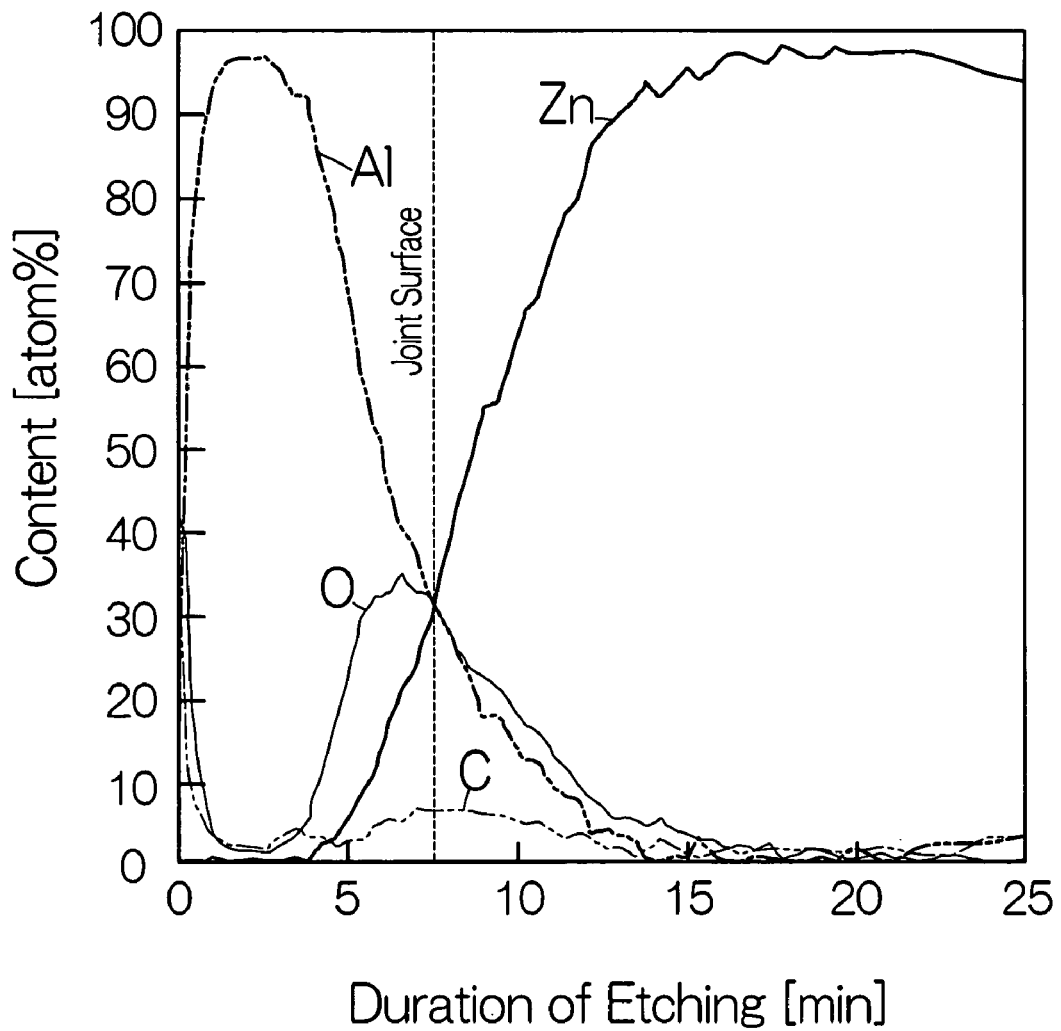
FIG. 8 is a graph showing the composition in a pad and the columnar conductor at various depths from the joint surface between the pad and the columnar conductor before heat treatment.
Figure 9:
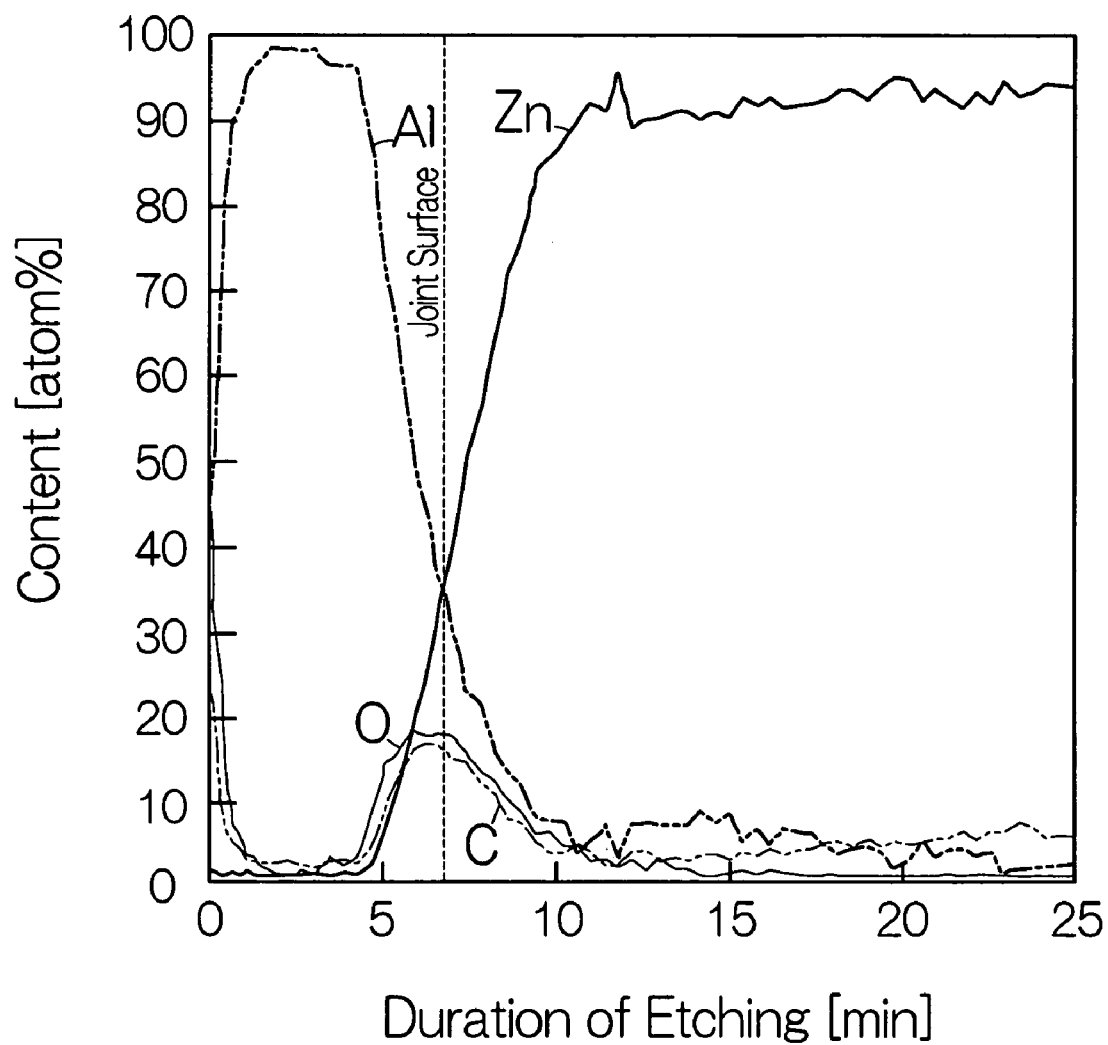
FIG. 9 is a graph showing the composition in the pad and the columnar conductor at various depths from the joint surface between the pad and the columnar conductor after the heat treatment.

The present inventors have observed the electric conduction between the wiring pattern 13 made of aluminum and the columnar conductor 15 made of Zn-0.65Al. A signal was transmitted through the wiring pattern 13 and the columnar conductor 15 before and after the heat treatment. No signal transmission was observed between the wiring pattern 13 and the columnar conductor 15 before the heat treatment. Electric conduction was observed between the wiring pattern 13 and the columnar conductor 15 after the heat treatment. The present inventors have subsequently observed the composition of the wiring pattern 13 and the columnar conductor 15 before and after the heat treatment. An Auger electron spectrometer (AES) was utilized for the observation in the same manner as described above. As shown in FIG. 8, the segregation of aluminum was observed in the columnar conductor 15. The atoms of aluminum moved toward the joint surface between the wiring pattern 13 and the columnar conductor 15. The diffusion of zinc was also observed from the columnar conductor 15 toward the wiring pattern 13. As shown in FIG. 9, oxygen decreased at the joint surface after the heat treatment. It has been confirmed that the reduction in the amount of oxygen, namely deoxidation, contributes to establishment of the electric conduction. It has also been confirmed that the heat treatment serves to accelerate the diffusion of zinc. It is assumed that the applied heat enables a chemical reaction between aluminum contained in the alumina ($Al_2O_3$) and zinc contained in the zinc oxide (ZnO) to generate a compound $Zn_nAl_m$, so that oxygen is released from the alumina and zinc oxide. This type of chemical reaction is likewise expected to be caused between the columnar conductor 15 and the wiring pattern 13 made of copper. Otherwise, electric conduction was established between the wiring pattern 13 and the columnar conductor 15 at the normal or room temperature when a radio-frequency (RF) plasma was utilized to form the wiring pattern 13, for example. A predetermined vacuum condition was in this case established during the application of the RF plasma. Formation of the wiring pattern 13 in an oxygen-free atmosphere enables omission of the aforementioned heat treatment.

Figure 10:
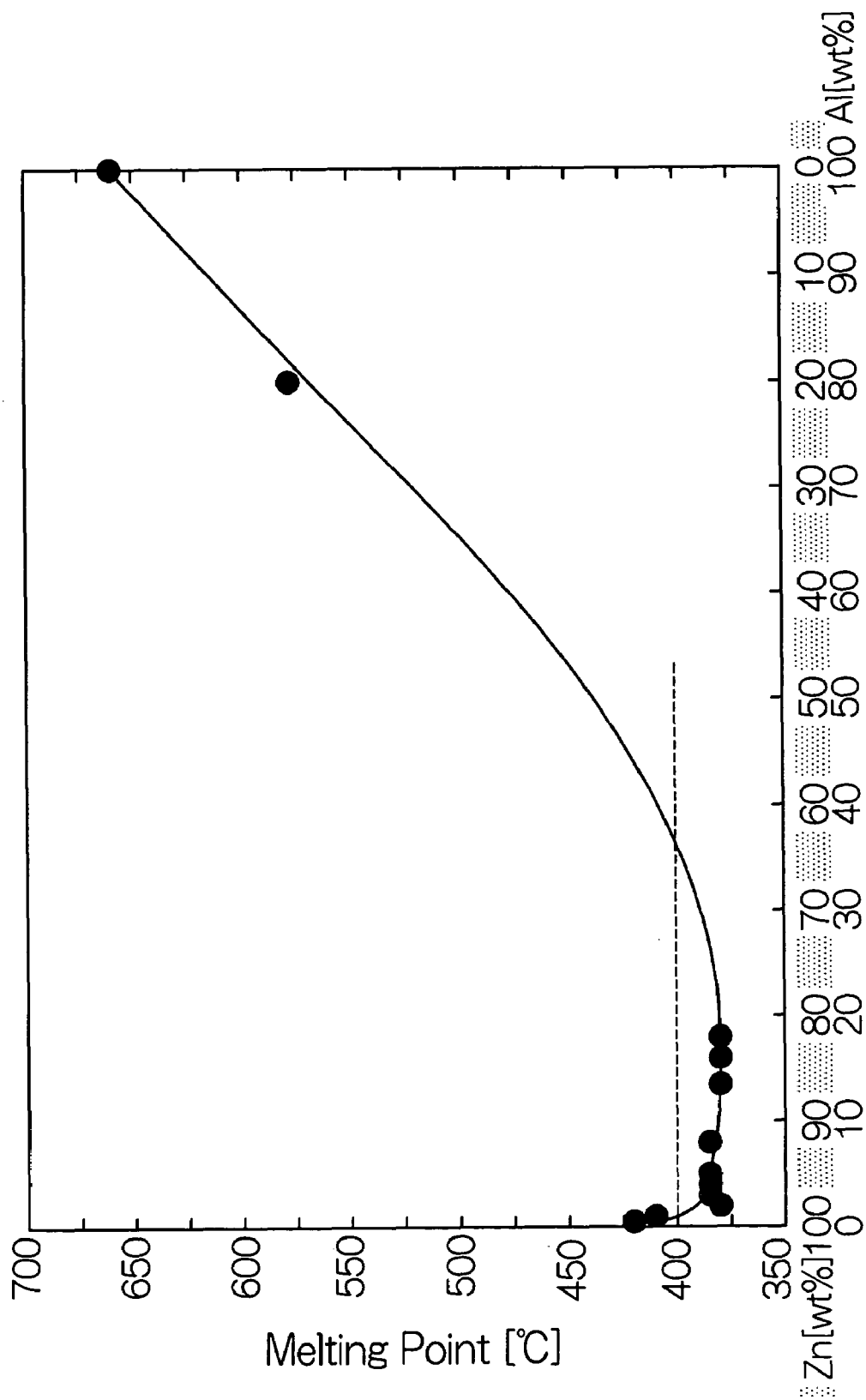
FIG. 10 is a graph showing the relationship between the composition of Zn—Al alloy and its melting point.

The present inventors have measured the melting point of Zn—Al alloy. As shown in FIG. 10, it has been confirmed that Zn—Al alloys containing aluminum at a content in the range between 0.001 weight % and 20.0 weight % reliably keep the melting point in the range between 370 degrees Celsius and 440 degrees Celsius. This range of temperature ensures a smaller load acting on the glass substrate 12 when the Zn—Al alloy fills the through holes 14. The melting point was kept equal to or higher than 400 degrees Celsius when Zn—Al alloys contained aluminum at a content equal to or smaller than 1.0 weight %. When Zn—Al alloys contained aluminum at a content larger than 80.0 weight %, the melting point exceeded 570 degrees Celsius.

Figure 11:
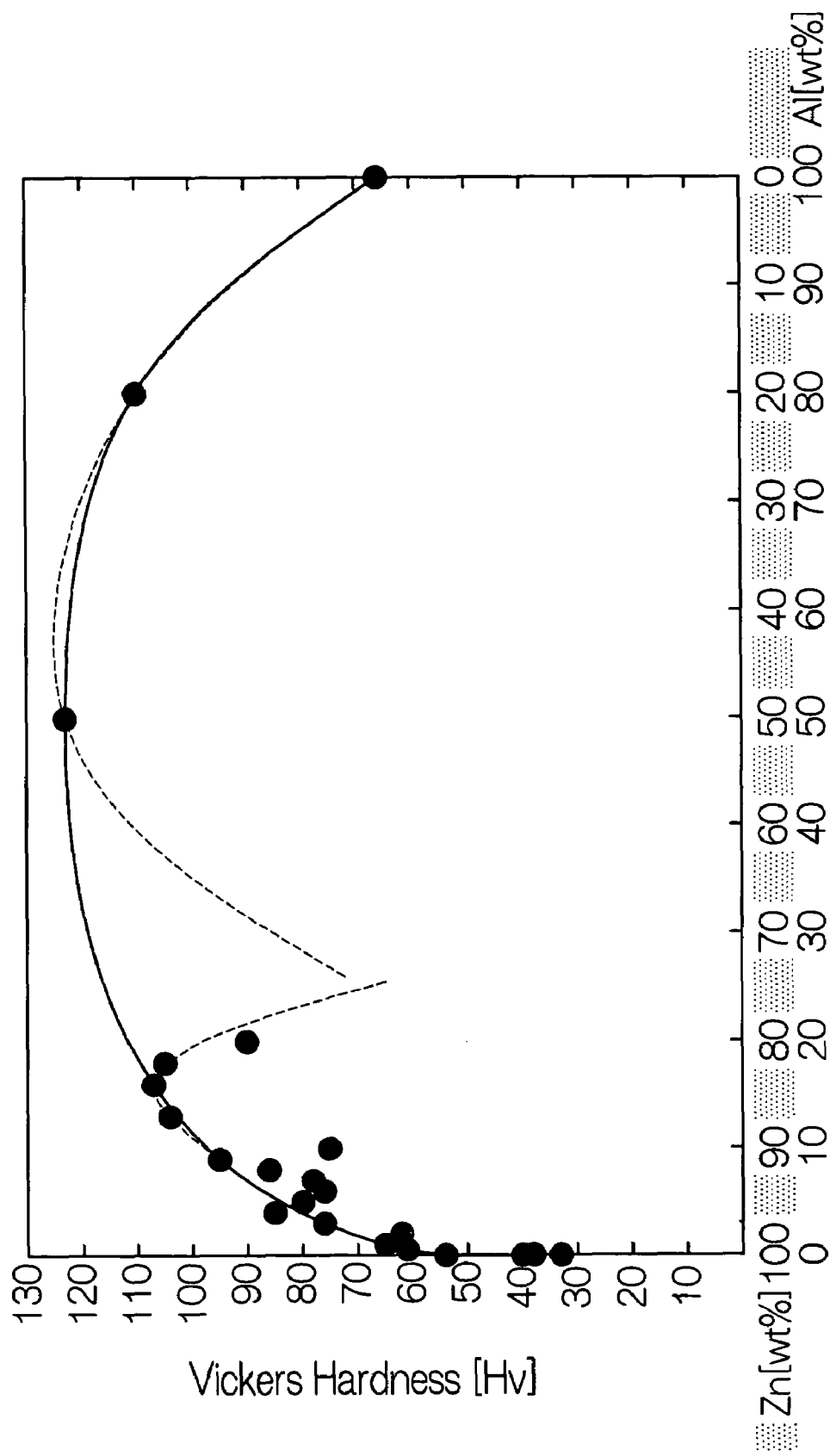
FIG. 11 is a graph showing the relationship between the composition of Zn—Al alloy and its Vickers hardness.

The present inventors have measured the hardness of Zn—Al alloy. As shown in FIG. 11, it has been confirmed that Zn—Al alloys containing aluminum at a content in the range between 0.001 weight % and 20.0 weight % reliably keep the hardness equal to or smaller than 110[Hv]. It has also been confirmed that a reduction in the content of aluminum from 16.0 weight % led to a further reduction in the hardness. Zn—Al alloys containing aluminum at a content smaller than 0.001 weight % were allowed to have the hardness of 37.86 [Hv].

Figure 12:
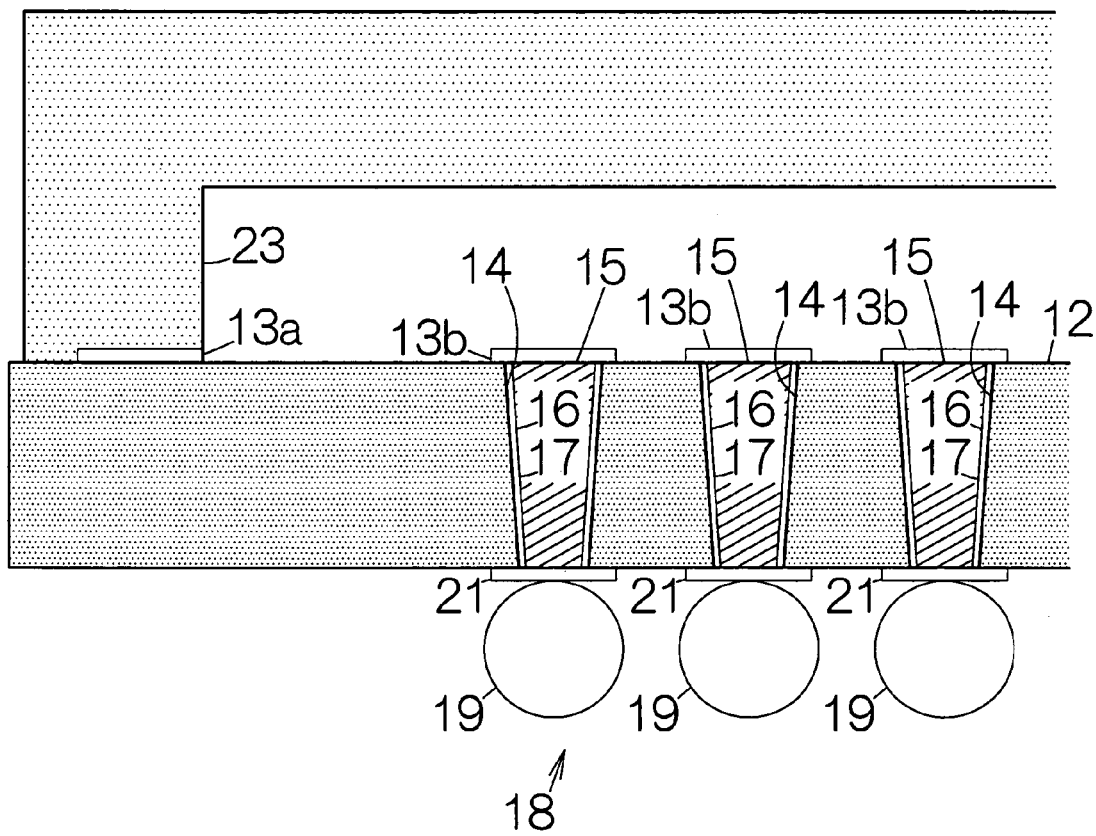
FIG. 12 is an enlarged partial sectional view schematically illustrating the structure of a package printed wiring board according to a second embodiment of the present invention.

FIG. 12 schematically illustrates a package printed wiring board 11a according to a second embodiment of the present invention. A silicon substrate 23 is bonded onto the glass substrate 12 in the package printed wiring board 11a. Anodic bonding may be utilized to bond the silicon substrate 23, for example. Signal lines on the silicon substrate 23 are individually connected to the pads 13a, for example. The signal lines are terminated at the outer periphery of the silicon substrate 23. Signals from the signal lines can reliably be taken out from the ball terminals 19, 19, . . . closely located on the glass substrate 12. Like reference numerals are attached to the structure or components equivalent to those of the aforementioned first embodiment.

Zn—Al alloy is utilized for the columnar conductors 15 in the package printed wiring board 11a. Here, the content of aluminum in the Zn—Al alloy may depend on the temperature of the anodic bonding. Zn—Al alloys containing aluminum at a content in the range between 0.001 weight % and 1.0 weight %, for example, keep the melting point equal to or higher than 400 degrees Celsius as described above. This results in a reliable avoidance of remelting of the columnar conductors 15 during the anodic bonding of a general type.

It should be noted that the glass substrate 12 may be immersed into the aforementioned molten Zn—Al alloy 22 in an oxygen-free atmosphere, for example. In this case, finer through holes 14 can reliably be filled with the molten Zn—Al alloy 22. The complete columnar conductors 15 can reliably be established.

What is claimed is:

1. A method of making a product, comprising:
    filling a hole defined in a body with Zn—Al alloy in a molten state, said Zn—Al alloy providing a conductor made of the Zn—Al allow in a solid state at least partially exposed on a surface of the body;
    forming a wiring on the surface of the body, the wiring connected to the conductor, and
    applying heat at least to the conductor and the wiring such that the conductor diffuses into the wiring.

2. The method according to claim 1, wherein the Zn—Al alloy contains aluminum at a content equal to or smaller than 1.0 weight %.

3. The method according to claim 1, wherein the Zn—Al alloy contains aluminum at a content equal to or smaller than 20.0 weight %.

4. The method according to claim 1, wherein said conductor fills a through hole penetrating through the body.

5. The method according to claim 4, wherein an aspect ratio of the through hole is set equal to or larger than 3.

6. The method according to claim 1, wherein the body is made of glass, silicon or ceramic.

7. The method according to claim 1, wherein the body is a glass substrate, a silicon substrate or a ceramic substrate.

8. The method according to claim 1, wherein the wiring is made of aluminum or copper.

9. The method according to claim 1, wherein the wiring is a wiring pattern located on a surface of the body.

10. The method according to claim 1, wherein the wiring is made of aluminum.

11. A method of making a product, comprising:
    filling a hold defined in a body with Zn—Al alloy in a molten state, said Zn—Al alloy providing a conductor made of the Zn—Al alloy in a solid state at least partially exposed on a surface of the body; and
    forming a wiring on the surface of the body in an oxygen-free atmosphere using a radio-frequency (RF) plasma, the wiring connected to the conductor.

12. The method according to claim 11, wherein the wiring is made of aluminum.

* * * * *